(12) United States Patent
Ogomi et al.

(10) Patent No.: US 10,001,532 B2
(45) Date of Patent: Jun. 19, 2018

(54) MAGNETIC SENSOR DEVICE

(71) Applicant: MITSUBISHI ELECTRIC CORPORATION, Chiyoda-ku (JP)

(72) Inventors: Tomokazu Ogomi, Chiyoda-ku (JP); Kenji Shimohata, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 66 days.

(21) Appl. No.: 15/307,965

(22) PCT Filed: May 12, 2015

(86) PCT No.: PCT/JP2015/063616
§ 371 (c)(1),
(2) Date: Oct. 31, 2016

(87) PCT Pub. No.: WO2015/174409
PCT Pub. Date: Nov. 19, 2015

(65) Prior Publication Data
US 2017/0052233 A1    Feb. 23, 2017

(30) Foreign Application Priority Data

May 13, 2014   (JP) .................................. 2014-099724

(51) Int. Cl.
*G01R 33/09*   (2006.01)
*G01R 33/02*   (2006.01)
(Continued)

(52) U.S. Cl.
CPC ....... *G01R 33/096* (2013.01); *G01R 33/0005* (2013.01); *G01R 33/02* (2013.01); *G01R 33/09* (2013.01); *G07D 7/04* (2013.01)

(58) Field of Classification Search
CPC ..... G01R 33/09; G01R 33/02; G01R 33/0005
See application file for complete search history.

(56) References Cited

U.S. PATENT DOCUMENTS 5,491,632 A * 2/1996 Pawlak ............. B62D 15/0215
                                                 701/1
5,644,226 A    7/1997 Aoyama et al.
(Continued)

FOREIGN PATENT DOCUMENTS

| JP | 7-294540 A | 11/1995 |
| JP | 2012-255770 A | 12/2012 |
| WO | 2010/052797 A1 | 5/2010 |

OTHER PUBLICATIONS

International Search Report dated Jul. 28, 2015 in PCT/JP2015/063616 filed May 12, 2015.

*Primary Examiner* — Jermele M Hollington
*Assistant Examiner* — Alvaro Fortich
(74) *Attorney, Agent, or Firm* — Oblon, McClelland, Maier & Neustadt, L.L.P.

(57) ABSTRACT

A magnetic sensor device includes: a magnet, extending in a longitudinal direction, that has different magnetic poles in a direction perpendicular to a conveyance direction of a detected object having a magnetic material, the longitudinal direction being orthogonal to the conveyance direction; and anisotropic magnetoresistive elements arranged linearly in the longitudinal direction on a detected object-side magnetic pole of the magnet, wherein the magnet is provided with a magnetic material yoke between the anisotropic magnetoresistive elements and the magnet, and the end of the magnet in the longitudinal direction has a greater length in the direction perpendicular to the conveyance direction than the center in the longitudinal direction.

17 Claims, 18 Drawing Sheets

(51) Int. Cl.
  *G01R 33/00* (2006.01)
  *G07D 7/04* (2016.01)

(56) References Cited

U.S. PATENT DOCUMENTS

| | | | | |
|---|---|---|---|---|
| 5,739,517 | A | * | 4/1998 | Hoshino ................ G06K 7/084 |
| | | | | 235/449 |
| 2002/0105322 | A1 | | 8/2002 | Schroeder et al. |
| 2003/0205998 | A1 | | 11/2003 | Heremans et al. |
| 2011/0291646 | A1 | * | 12/2011 | Musha ................ G01D 5/2457 |
| | | | | 324/207.11 |
| 2014/0028308 | A1 | | 1/2014 | Ogomi et al. |

* cited by examiner

FIG.4A      FIG.4B      FIG.4C
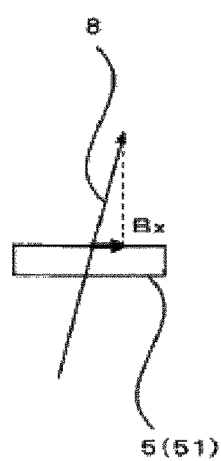 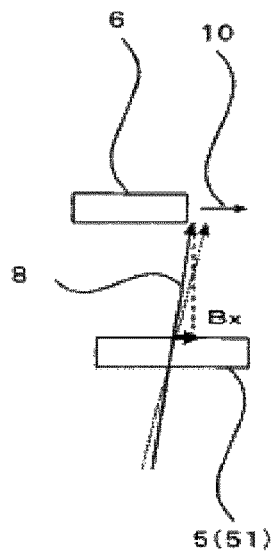 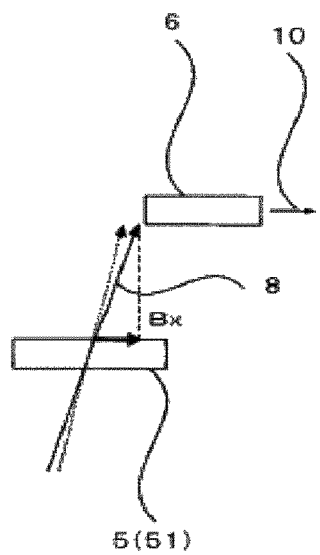
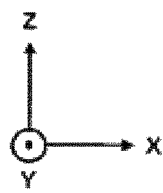

FIG.18
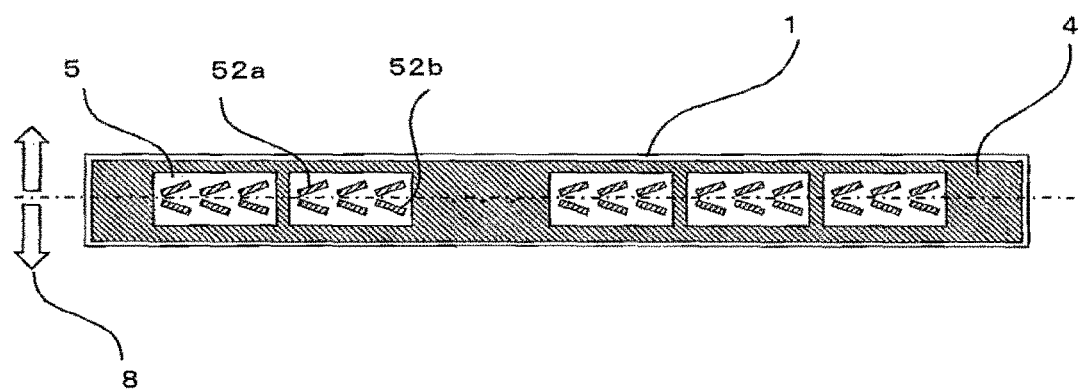
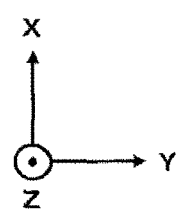

FIG.19
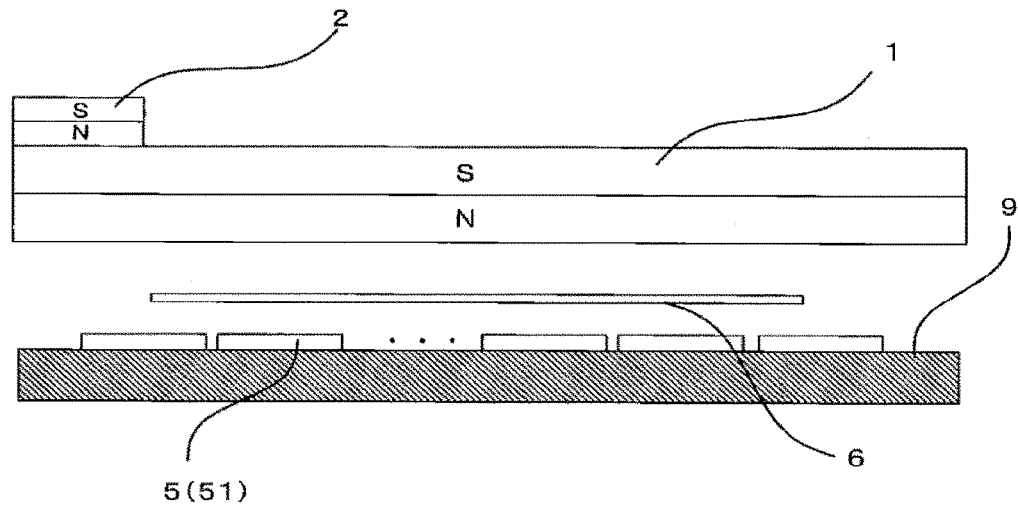
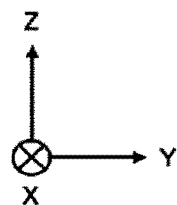
FIG.20
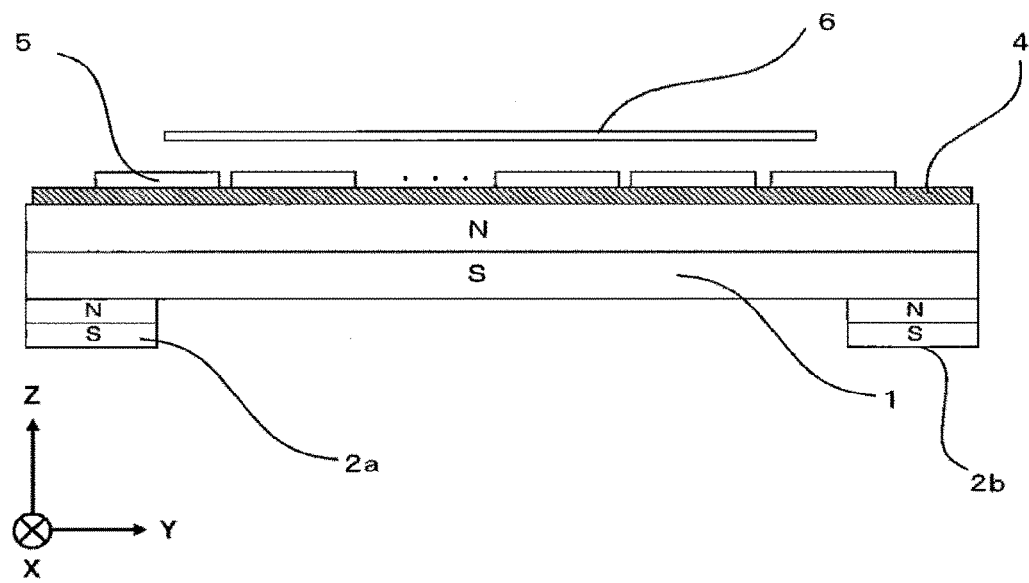

MAGNETIC SENSOR DEVICE

TECHNICAL FIELD

The present disclosure relates to a magnetic sensor device for detection of a fine magnetic pattern formed on a paper sheet-like medium such as paper currency and the like.

BACKGROUND ART

A magnetic sensor device is a sensor device that uses a plurality of magnetoresistive elements for which the property of resistance value changes with change in magnetic flux density. In a magnetic sensor device for simultaneous multi-channel detection of a magnetic pattern included in a paper sheet-like medium such as paper currency and the like, the amount of magnetization of the magnetic pattern is minute, and thus in order to detect the magnetic pattern with good sensitivity, anisotropic magnetoresistive elements are used that have higher sensitivity than semiconductor magnetoresistive elements under a magnetic environment that all of the plurality of anisotropic magnetoresistive element are highly sensitive without magnetic saturation, and the paper sheet-like medium such as paper currency and the like is required to pass through the magnetically strong environment.

The sensing direction of the anisotropic magnetoresistive element is the short-side direction, and reading of magnetic ink is achieved by application of a bias magnetic flux density that most increases sensitivity in the detection direction. A magnetic sensor device that uses an anisotropic magnetoresistive element is disclosed in Unexamined Japanese Patent Application Kokai Publication No. 2012-255770 (Patent Literature 1).

CITATION LIST

Patent Literature

Patent Literature 1: Unexamined Japanese Patent Application Kokai Publication No. 2012-255770

SUMMARY OF INVENTION

Technical Problem

However, the magnetic sensor device described in Patent Literature 1 ideally has a structure that does not apply the magnetic flux in the non-magnetosensitive direction (longitudinal direction) of the anisotropic magnetoresistive element, and thus the magnetic vectors become directed only in the detection direction (short-side direction). However, due to the length of the magnet in an actual product being limited, the magnetic flux becomes applied, along the magnet longitudinal direction, in each of the outward directions from the center of the magnet, and magnetic flux density is applied also in the non-magnetosensitive direction (longitudinal direction) of the anisotropic magnetoresistive element. The application of magnetic flux density in the non-magnetosensitive direction (longitudinal direction) occurs due to factors such as variability of magnetic force of the magnet, variability in the shape of the magnet/magnetic material, variability in fabrication and the like.

Due to such factors, the anisotropic magnetoresistive element has a magnetic vector tilted toward the direction of the magnetic flux density applied in the non-magnetosensitive direction (longitudinal direction). However, the non-magnetosensitive direction (longitudinal direction) may change (become flipped) depending on mounting position, and in the case of reading a magnetic pattern tilted in a planar direction, due to the relationship between the direction of the non-magnetosensitive direction (longitudinal direction) of the magnetic vector of the anisotropic magnetoresistive element and the non-magnetosensitive direction (longitudinal direction) of the magnetic vector generated by the magnetic pattern, a problem occurs in that the location where the anisotropic magnetoresistive element is mounted changes the magnitude of output.

The present disclosure is developed in order to solve the aforementioned problem, and has the object of making uniform the directions of bias magnetic flux density applied in the non-magnetosensitive direction (longitudinal direction) of the anisotropic magnetoresistive element, and obtaining a magnetic sensor device capable of acquiring stable output from each anisotropic magnetoresistive element mounted linearly, without the magnetic sensor device being affected by shape of the magnetic pattern.

Solution to Problem

The magnetic sensor device of the present disclosure includes:

a magnet extending in a longitudinal direction orthogonal to a conveyance direction of a detected object having a magnetic material, the magnet having magnetic poles that are different in a direction perpendicular to the conveyance direction; and anisotropic magnetoresistive elements arranged linearly in the longitude direction on a detected object-side magnetic pole of the magnet, wherein a length of the magnet in the direction perpendicular to the conveyance direction is longer for an end portion in the longitudinal direction than for a central portion in the longitudinal direction.

Advantageous Effects of Invention

Per the present disclosure, an end portion of a magnet in the longitudinal direction has a length, in a direction perpendicular to a conveyance direction, that is greater than a length of the magnet, in the direction perpendicular to the conveyance direction, of a longitudinal-direction center portion. Thus application becomes possible of a bias magnetic flux density for forcefully in the same direction to the non-magnetosensitive direction (longitudinal direction) of each linearly arranged and mounted anisotropic magnetoresistive element, thereby enabling stable output at the same level by the plurality of anisotropic magnetoresistive elements, even when the magnetic pattern is tilted in the planar direction.

BRIEF DESCRIPTION OF DRAWINGS

FIGS. 4A-4C is a magnetic line vector diagram for description of principals of detection of the magnetic sensor device;

FIG. 18 is a top view of the magnetic sensor device in Embodiment 4 of this disclosure, as viewed from above;

FIG. 19 is a side view of a longitudinal-direction of the magnetic sensor device in Embodiment 5 of this disclosure;

FIG. 20 is a side view of a longitudinal-direction of the magnetic sensor device in Embodiment 6 of this disclosure;

DESCRIPTION OF EMBODIMENTS

Embodiment 1

In all embodiments of this disclosure, including Embodiment 1, the conveyance direction of a detected object, that is, the short-side direction of the magnetic device is defined as the X direction, the longitudinal direction of the magnetic sensor device (the linear direction) orthogonal to the conveyance direction of the detected object is defined as the Y direction, and the direction (direction orthogonal to the conveyance direction) orthogonal to the short-side direction (conveyance direction) and the longitudinal direction (the linear direction) of the magnetic sensor device is defined as the Z direction.

Figure 1:
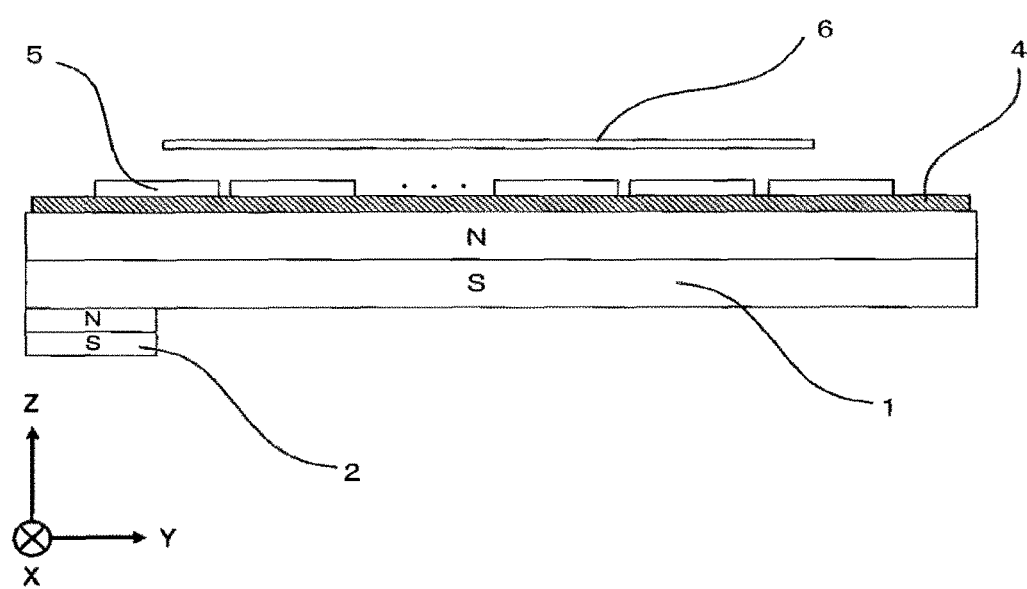
FIG. 1 is a side view of a longitudinal-direction of a magnetic sensor device in Embodiment 1 of this disclosure.
Figure 2:
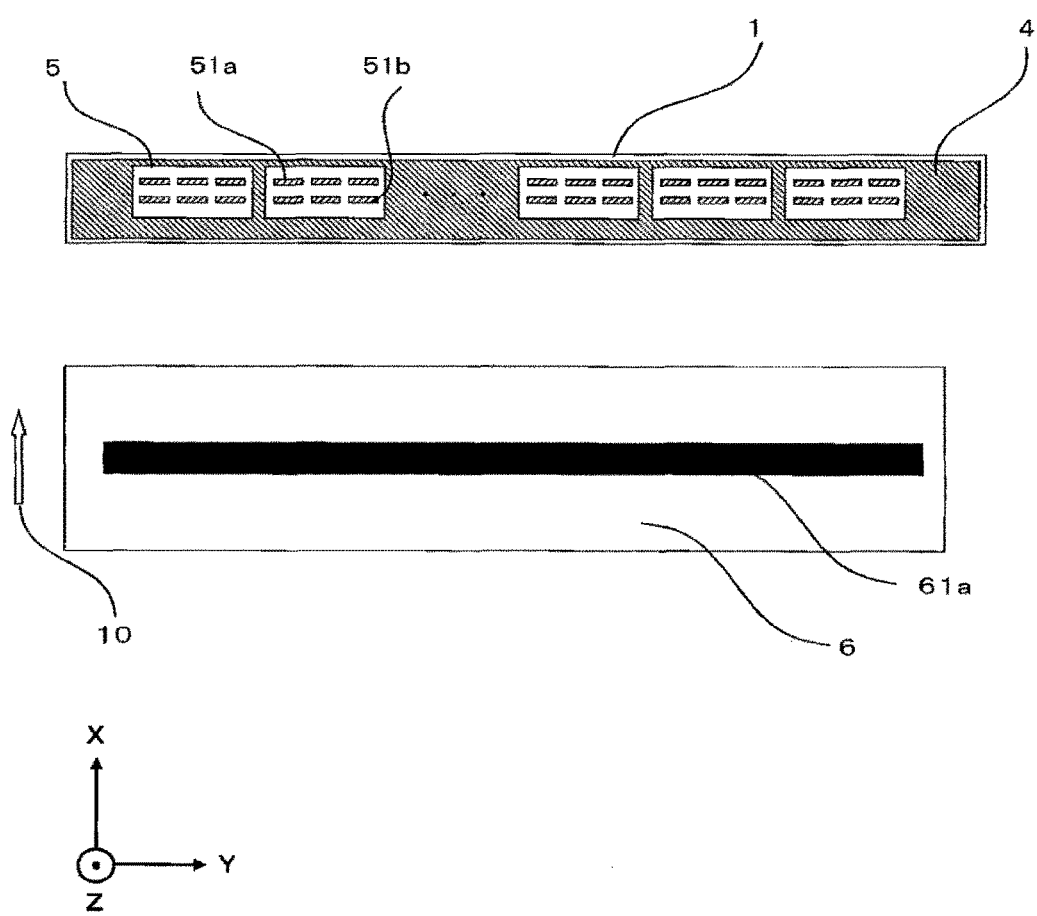
FIG. 2 is a top view of the magnetic sensor device in Embodiment 1, as viewed from above.

FIG. 1 is a side view of the longitudinal direction of the magnetic sensor device of the Embodiment 1 of this disclosure. FIG. 2 is a top view of the magnetic sensor device of Embodiment 1 of this disclosure, as viewed from above. In FIGS. 1 and 2, the magnetic sensor device is equipped with:

a first magnet 1 extending in the longitudinal direction, having magnetic poles that are in mutually opposite directions orthogonal to a conveyance direction 10 of a detected object 6 that has a magnetic material, the longitudinal direction being taken to be a direction orthogonal to the conveyance direction 10, and length in the direction orthogonal to the conveyance direction 10 being the same along the longitudinal direction;

an anisotropic magnetoresistive (AMR) element chip 5 having anisotropic magnetoresistive (AMR) elements 51 arranged linearly in the longitudinal direction and shifted to predetermined positions in the conveyance direction 10 from the central position in the conveyance direction 10 of the first magnet 1; and a second magnet 2, as a minute magnet, arranged at a longitudinal-direction end portion of the first magnet 1 in the direction orthogonal to the conveyance direction 10, the second magnet 2 having magnetic poles that are in mutually opposite directions orthogonal to the conveyance direction 10, and the magnetic pole of a face contacting the first magnet 1 being different from the magnetic pole of the first magnet 1.

In FIGS. 1 and 2, the anisotropic magnetoresistive (AMR) element chip 5 is arranged on the detected object 6-side of the first magnet 1. The magnetic poles of the first magnet 1 and the second magnet 2 are arranged such that the anisotropic magnetoresistive element chip 5 (anisotropic magnetoresistive (AMR) elements 51)-side are the N poles, and the anisotropic magnetoresistive element chip 5 (anisotropic magnetoresistive (AMR) elements 51)-opposite side are the S poles.

In FIGS. 1 and 2, the first magnet 1 applies a bias magnetic flux to a magnetic ink 61a arranged on the detected object 6 and to the anisotropic magnetoresistive (AMR) elements 51 (51a and 51b) arranged on the anisotropic magnetoresistive element chip 5. With the object of absorbing variability of the first magnet 1 and imparting a uniform bias magnetic flux to the anisotropic magnetoresistive (AMR) elements 51, the anisotropic magnetoresistive (AMR) element chip 5 is mounted on a first magnetic material yoke 4, and the first magnetic material yoke 4 is arranged at the N pole side of the first magnet 1. As the second magnet 2, the minute magnet is provided at one end portion of the S pole side of the first magnet, with the object of applying a fixed-direction magnetic flux vector Y-direction component By. Further, the N pole of the second magnet 2 faces the S pole of the first magnet 1. The detected object 6 is conveyed in the X direction of FIGS. 1 and 2, and the magnetic ink 61a is detected while passing above the anisotropic magnetoresistive (AMR) elements 51. Further, the anisotropic magnetoresistive (AMR) element chip 5 is disposed somewhat displaced in the X direction from the X-direction center of the first magnet 1.

Moreover, components that would exist in an actual product are omitted from this figure, such as a housing for retaining the aforementioned first magnet 1 and the like, a substrate for acquiring output from, and applying electrical power to, the anisotropic magnetoresistive (AMR) element 51 (51a, 51b), a shield cover arranged to prevent contact with the magnetoresistive elements 51 during conveyance of the detected object 6, and the like.

Figure 3:
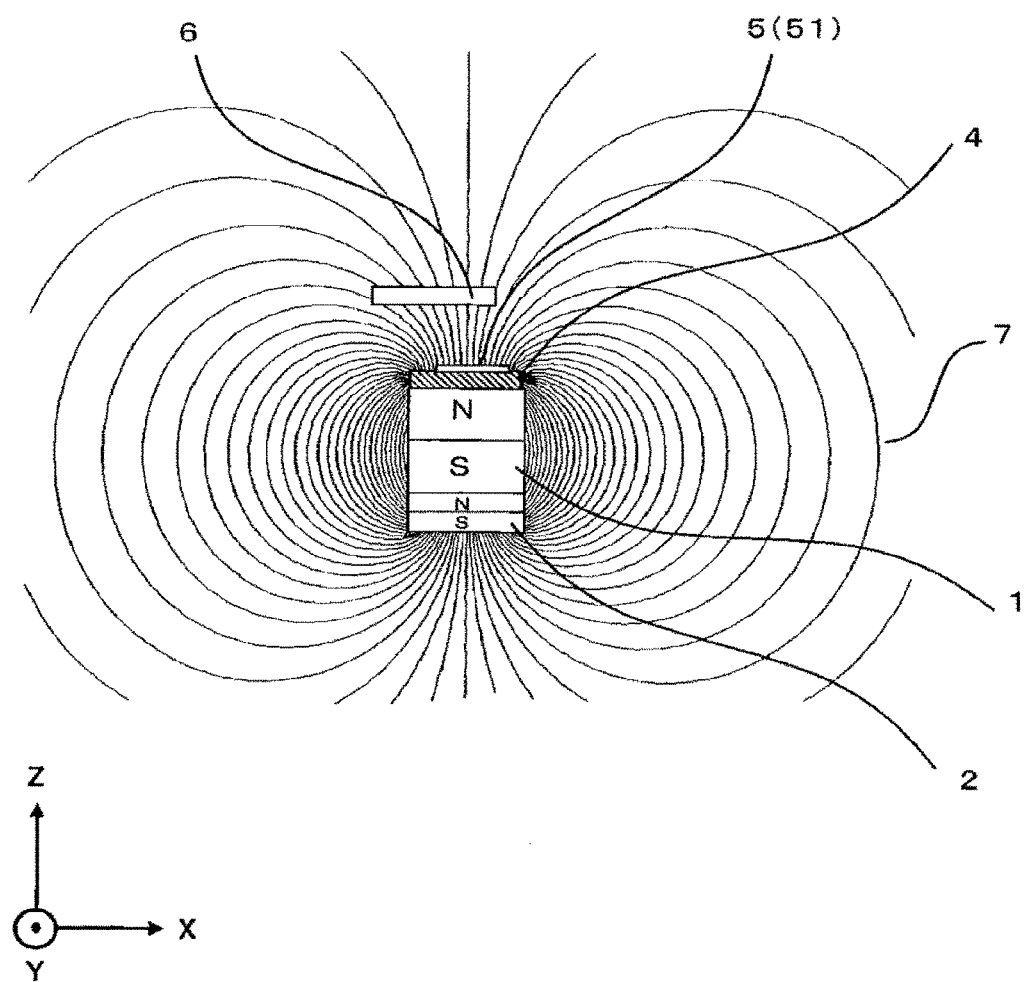
FIG. 3 is a diagram of distribution of magnetic field lines, as seen in the X-Z plane, of the magnetic sensor device in Embodiment 1 of this disclosure.

FIG. 3 is a diagram of the distribution of magnetic field lines of the magnetic sensor device of Embodiment 1 of this disclosure, as viewed in the X-Z plane, illustrating magnetic field lines 7 formed by the first magnet 1, second magnet 2, and first magnetic material yoke 4. At the position of the anisotropic magnetoresistive (AMR) elements 51 (Ma, 51b), the magnetic field lines are slightly tilted toward the X direction, and an X-direction component Bx of the magnetic flux vectors is applied to the anisotropic magnetoresistive (AMR) elements 51. Here, the magnetic flux vector X-direction component Bx is a minute magnetic field with a magnitude of several mT. Further, a magnetic flux of several 100 mT magnitude is applied to the detected object 6 and has a Z-direction component Bz as the main component of the magnetic flux vector. The magnetic ink 61a is magnetized, and the anisotropic magnetoresistive (AMR) element 51 (51a, 51b) detects the magnetization component of the magnetic ink 61a.

Detection of the detected object 6 is described in detail using FIGS. 3 and 4. FIG. 4A to 4C is a magnetic field line vector diagram for description of the principles of detection by the magnetic sensor device. In FIG. 3, due to slight X-direction separation of the anisotropic magnetoresistive (AMR) element 51 (51a, 51b) from the central axis of the conveyance direction length of the first magnetic material yoke 4, as illustrated in FIG. 4A, the magnetic flux vectors 8 of the magnetic field lines 7 are tilted slightly toward the conveyance direction (X direction) from the perpendicular direction (Z direction), and this conveyance direction (X direction) component Bx of the magnetic flux vector 8 acts as a bias flux for the anisotropic magnetoresistive (AMR) element 51 (51a, 51b).

When the detected object 6 approaches, as illustrated in FIG. 4B, the magnetic flux vector 8, as if sucked into the detected object 6, is tilted toward the detected object 6 side, and thus the conveyance-direction (X-direction) magnetic flux vector 8 component (Bx) becomes smaller. When the detected object 6 draws away, as illustrated in FIG. 4C, the magnetic flux vector 8, as if being pulled by the detected object 6, is tilted toward the detected object 6 side, and thus the conveyance-direction (X-direction) magnetic flux vector 8 component (Bx) becomes larger. Thus resistance value of the anisotropic magnetoresistive (AMR) element 51 (51a, 51b) magnetosensitive to the X-direction component changes, enabling detecting of the detected object 6. That is to say, the conveyance-direction (X-direction) magnetic flux vector 8 component (Bx) changes due to passage of the detected object 6, and thus resistance value of the anisotropic magnetoresistive (AMR) element 51 (51a, 51b) magnetosensitive to the X-direction component changes, thereby enabling detection of the detected object 6. In FIGS. 4B and 4C, the dotted-line arrows intersecting the magnetic flux vectors 8 indicate the positions of the magnetic flux vectors 8 in FIG. 4A.

Figure 5:
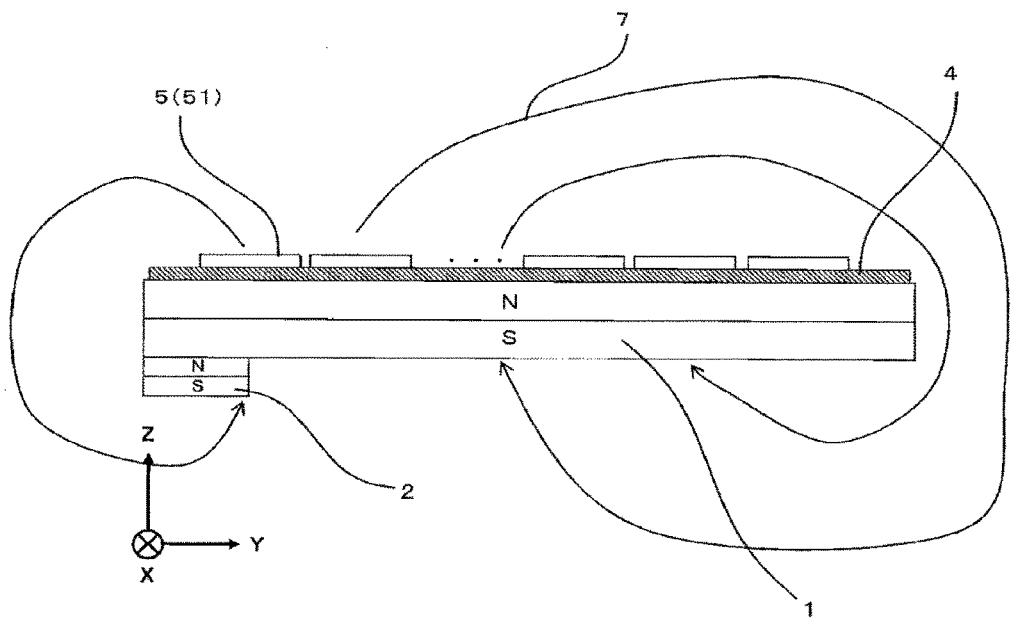
FIG. 5 is a diagram of the distribution of the magnetic field lines occurring in FIG. 1.

FIG. 5 is a diagram of the distribution of magnetic field lines in FIG. 1 and illustrates the magnetic field lines 7 formed by the first magnet 1, second magnet 2 and first magnetic material yoke 4, as viewed in the YZ plane. A +By-direction (magnetic flux vector positive Y-direction component) magnetic flux is applied to most of the anisotropic magnetoresistive (AMR) elements 51 (51a, 51b).

Figure 6:
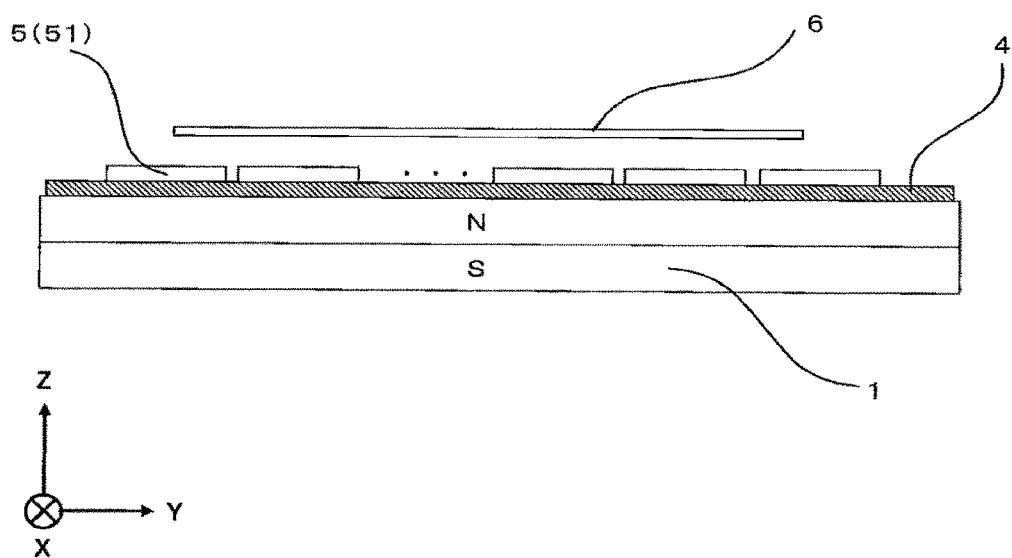
FIG. 6 is a diagram illustrating the magnetic sensor of FIG. 1 after removal of a second magnet 2.
Figure 7:
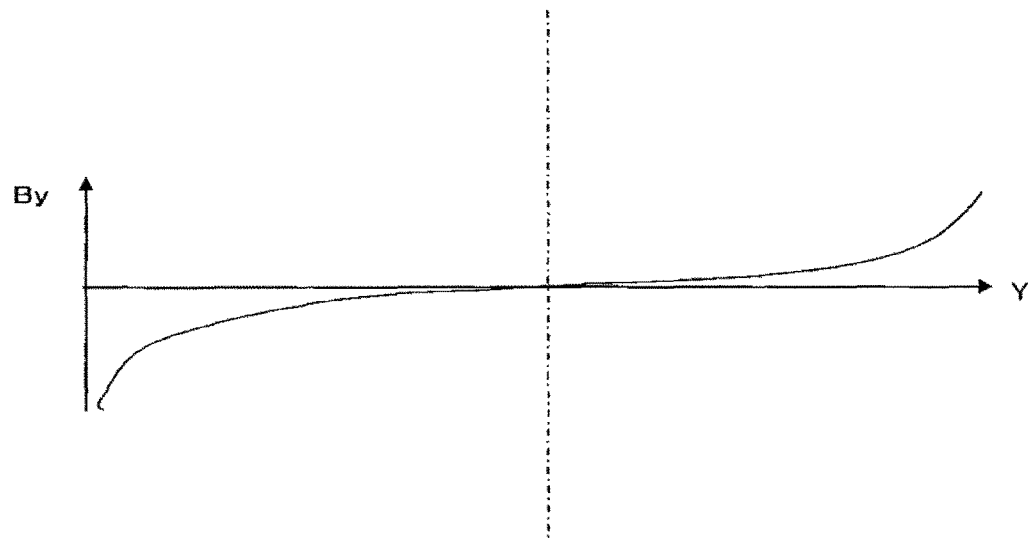
FIG. 7 is a graph illustrating a By component applied to the anisotropic magnetoresistive elements of FIG. 6.

Here, general magnetic sensor operation is described using FIG. 6 through FIG. 11. FIG. 6 illustrates the magnetic sensor of FIG. 1 with the second magnet 2 removed. FIG. 7 is a graph illustrating the By component (Y-direction component of the magnetic flux vector) applied to the anisotropic magnetoresistive (AMR) element in FIG. 6. In FIG. 7, the dot-dash line indicates the center position in the longitudinal direction (Y direction) of the magnetic sensor device. Moreover, both Y-direction ends of the graph correspond to both longitudinal-direction (Y-direction) ends of the magnetic sensor device. At this time, as indicated by the description using FIG. 3, an X-direction component Bx of the bias magnetic flux is applied to the anisotropic magnetoresistive (AMR) elements 51. Here, the first magnet 1 has a finite length, and thus, the By component (Y-direction component of the magnetic flux vector) illustrated in FIG. 7 is also applied to the anisotropic magnetoresistive (AMR) elements 51, and the By component has lateral-direction-opposite polarity and is symmetric with respect to the center of the magnet. Further, although a Bz component (Z-direction component of the magnetic flux vector) of several 100 mT magnitude is also applied to the anisotropic magnetoresistive (AMR) element 51 (51a, 51b), the Bz component has no effect on detection of magnetic flux change and thus is omitted from the description.

Figure 8:
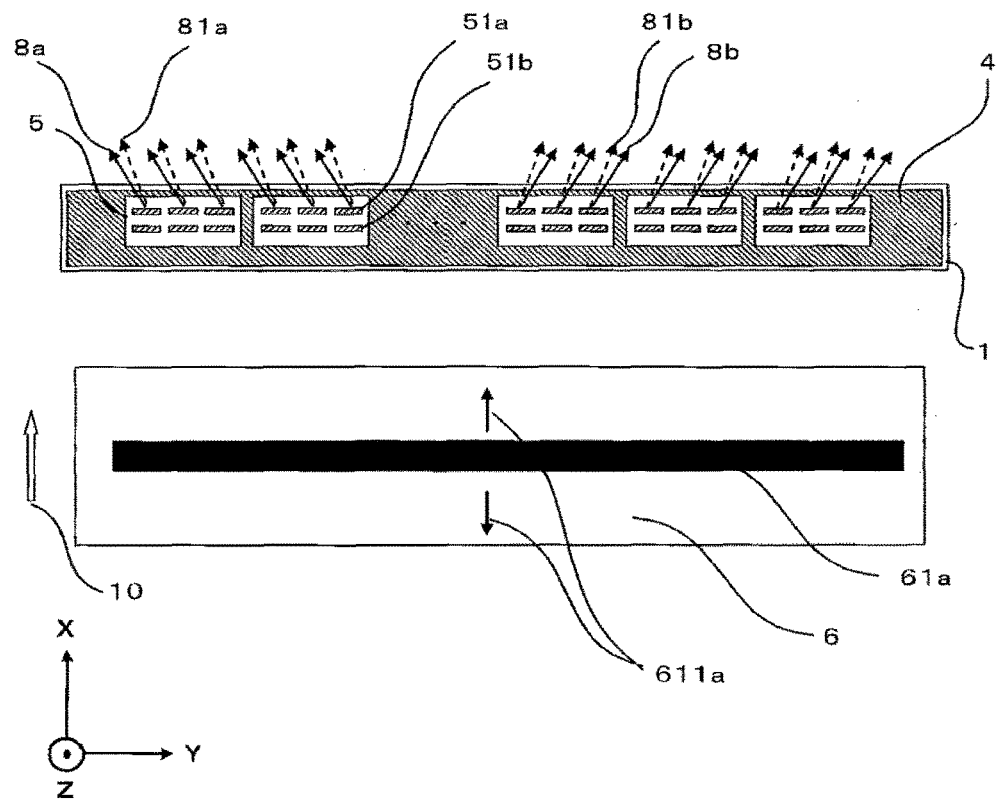
FIG. 8 is a diagram illustrating a cross-section of the configuration of FIG. 6, as viewed from above, and illustrating the bias magnetic flux vectors applied to each anisotropic magnetoresistive element.
Figure 9:
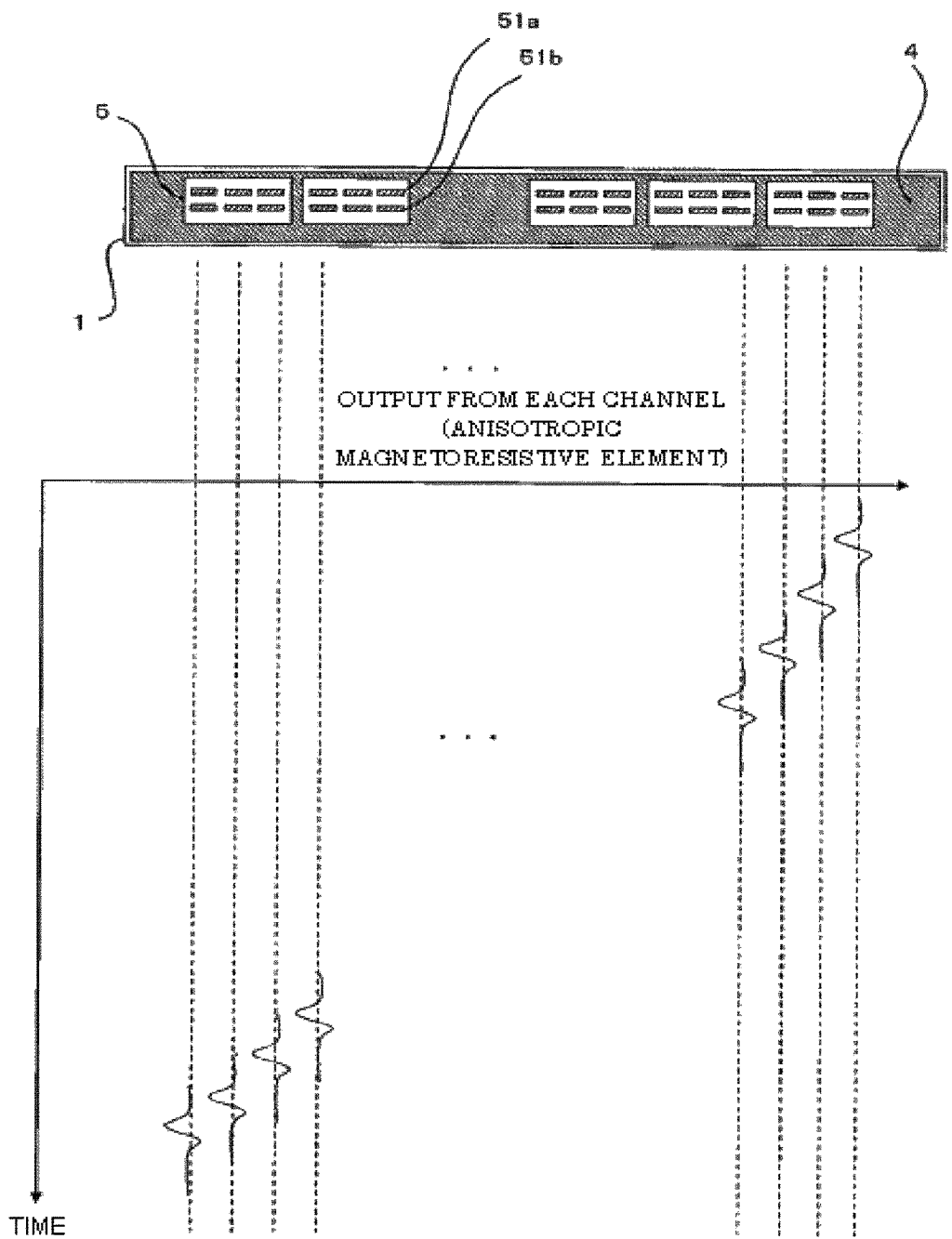
FIG. 9 is a diagram illustrating output of each of the anisotropic magnetoresistive elements of FIG. 8.

FIG. 8 is a cross-sectional drawing of the structure of FIG. 6, as viewed from above, and is a diagram illustrating the bias magnetic flux vectors applied to each of the anisotropic magnetoresistive (AMR) elements. A top view of the structure of FIG. 6 is illustrated in FIG. 8, as viewed from above, and the illustrated bias magnetic flux vectors 8 are applied to each anisotropic magnetoresistive (AMR) element by the first magnet 1 and the first magnetic material yoke 4. Due to the effect of the By component (Y-direction component of the magnetic flux vector), a magnetic flux vector 8a tilted toward the −Y direction is applied to the anisotropic magnetoresistive (AMR) elements in the −Y direction from the center, and a magnetic flux vector 8b tilted toward the +Y direction is applied to the anisotropic magnetoresistive (AMR) elements in the +Y direction from the center. Further, FIG. 9 is a diagram illustrating output of each of the anisotropic magnetoresistive (AMR) elements in FIG. 8, and the output of each anisotropic magnetoresistive (AMR) element in FIG. 8 is illustrated in FIG. 9.

In FIG. 8, in the case of conveyance of the magnetic ink 61a that is parallel to the Y direction, a magnetic flux change 611a occurs in the direction (X direction) perpendicular to the magnetic ink 61a due to the Y-direction-parallel magnetic ink 61a, and an X-direction magnetic flux change occurs for both a bias magnetic flux vector 8a that is tilted toward the −Y direction and a bias magnetic flux vector 8b that is tilted toward the +Y direction. Vector rotation occurs (change to opposite direction after passing through the magnetic ink 61a), resulting in a detection magnetic flux vector 81a tilted toward the −Y direction, and a detection magnetic flux vector 81b tilted toward the +Y direction, and the output illustrated in FIG. 9 is obtained from each of the magnetoresistive elements 51 (51a, 51b).

Figure 10:
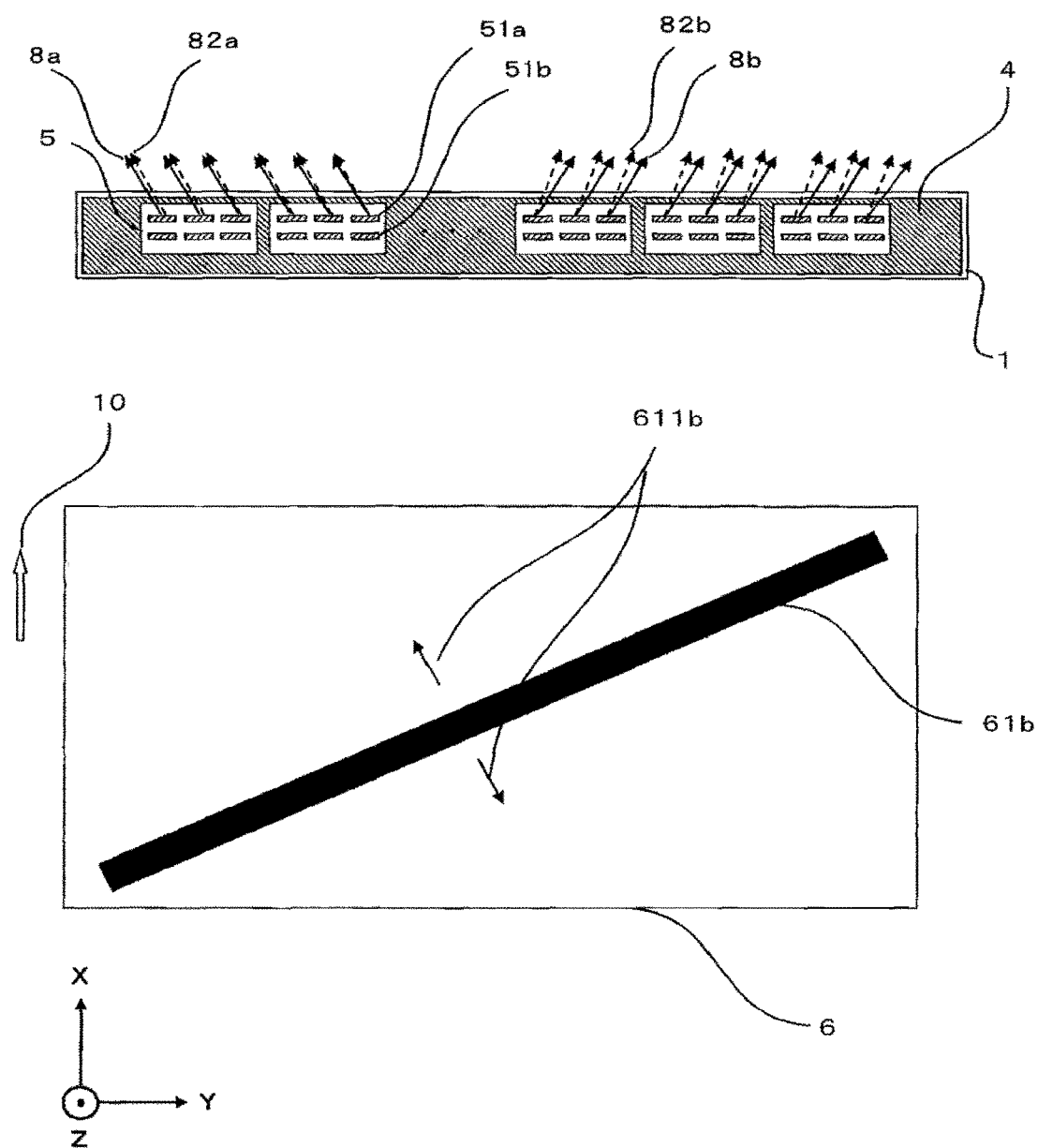
FIG. 10 is a diagram illustrating detection magnetic flux vectors, for the configuration of FIG. 6, in a case in which the magnetic ink rotated counterclockwise in the X-Y plane is conveyed.
Figure 11:
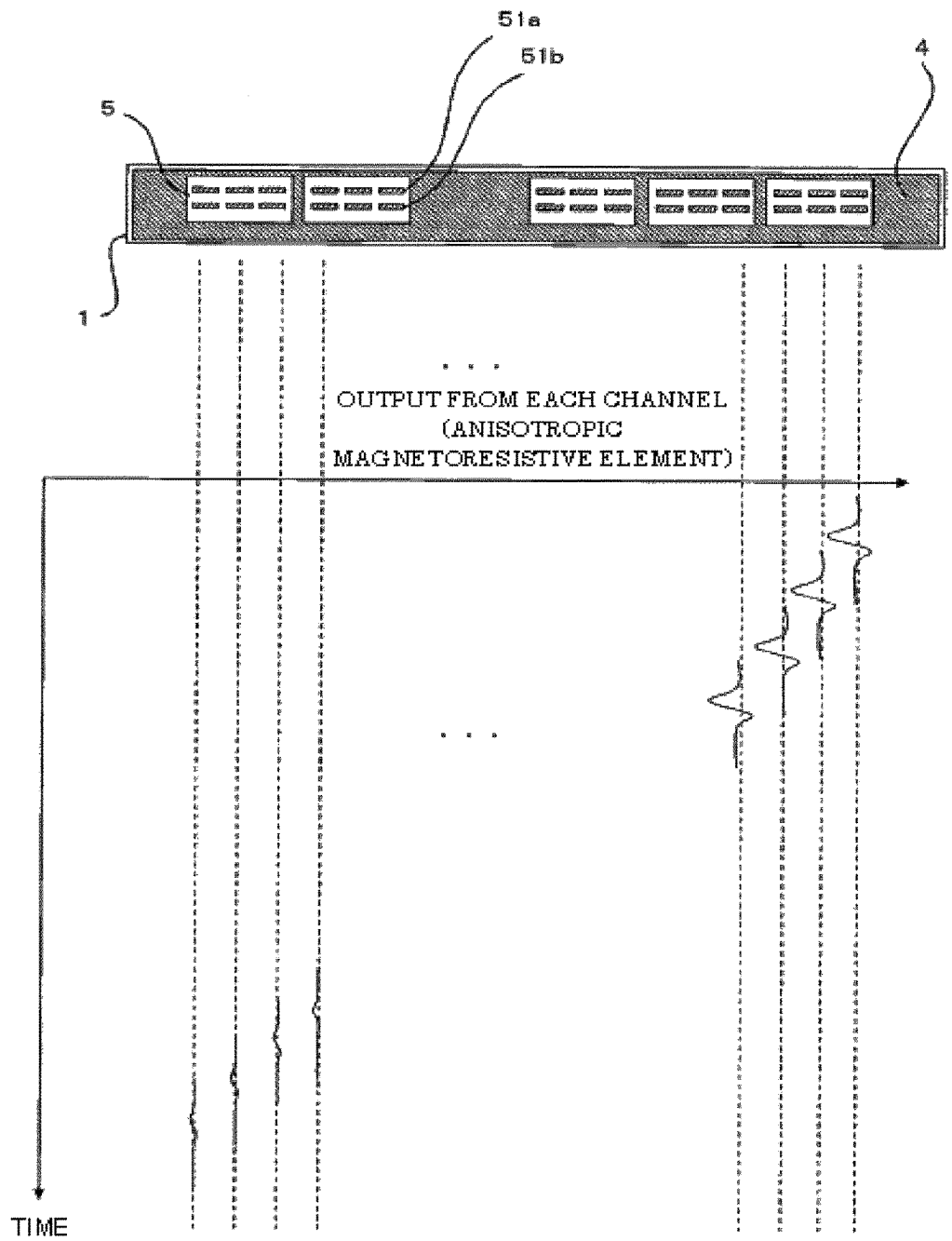
FIG. 11 is a diagram illustrating output of each of the anisotropic magnetoresistive elements of FIG. 10.

Next, FIGS. 10 and 11 are used for description of a case in which the magnetic ink 61b rotated counterclockwise in the X-Y plane is conveyed. FIG. 10 is a diagram illustrating the detection magnetic flux vectors in the case in which the magnetic ink rotated counterclockwise in the X-Y plane is conveyed, for the configuration of FIG. 6. FIG. 11 is a diagram illustrating output of each of the anisotropic magnetoresistive (AMR) elements in FIG. 10.

As illustrated in FIG. 10, a magnetic flux change 611b is generated by the magnetic ink 61b in the direction perpendicular to the magnetic ink 61b. The direction of this magnetic flux change 611b is nearly the same as the bias magnetic flux vectors 8a tilted toward the −Y direction, and thus in the anisotropic magnetoresistive (AMR) elements 51 (51a, 51b) disposed in the −Y direction from the center, the difference between the bias magnetic flux vectors 8a and the detection magnetic flux vectors 82a tilted toward the −Y direction becomes small, and the output becomes small as illustrated in FIG. 11. Conversely, in the anisotropic magnetoresistive (AMR) elements 51 (51a, 51b) disposed in the +Y direction, the difference between the bias magnetic flux vectors 8b and the detection magnetic flux vectors 82b tilted toward the +Y direction becomes large, and the output becomes large as illustrated in FIG. 11.

When the direction of the Y-direction bias magnetic flux differs in this manner for each of the anisotropic magnetoresistive (AMR) elements 51 (51a, 51b), element-by-element variability occurs in the resultant output of the detected object 6 for the anisotropic magnetoresistive (AMR) elements 51 (51a, 51b).

Figure 12:
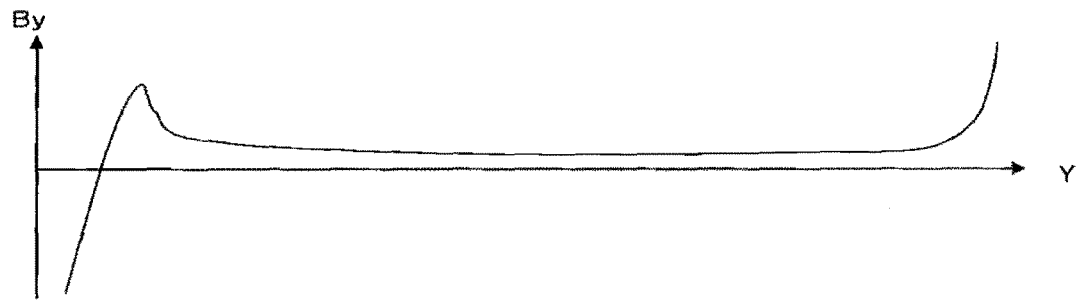
FIG. 12 is a graph illustrating the By component applied to the anisotropic magnetoresistive elements in Embodiment 1 of this disclosure.
Figure 13:
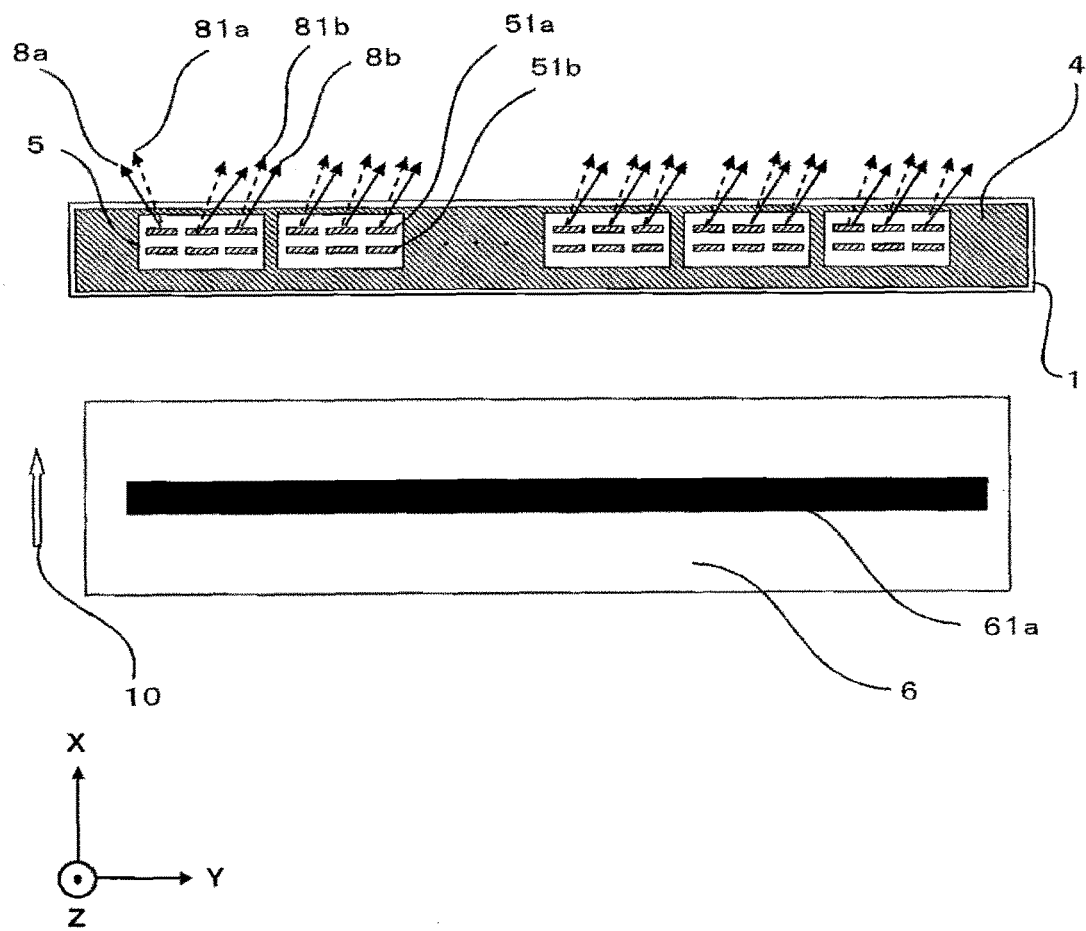
FIG. 13 is a diagram illustrating bias magnetic flux vectors and detection magnetic flux vectors in a case in which the magnetic ink perpendicular to the Y direction is conveyed, for Embodiment 1 of this disclosure.
Figure 14:
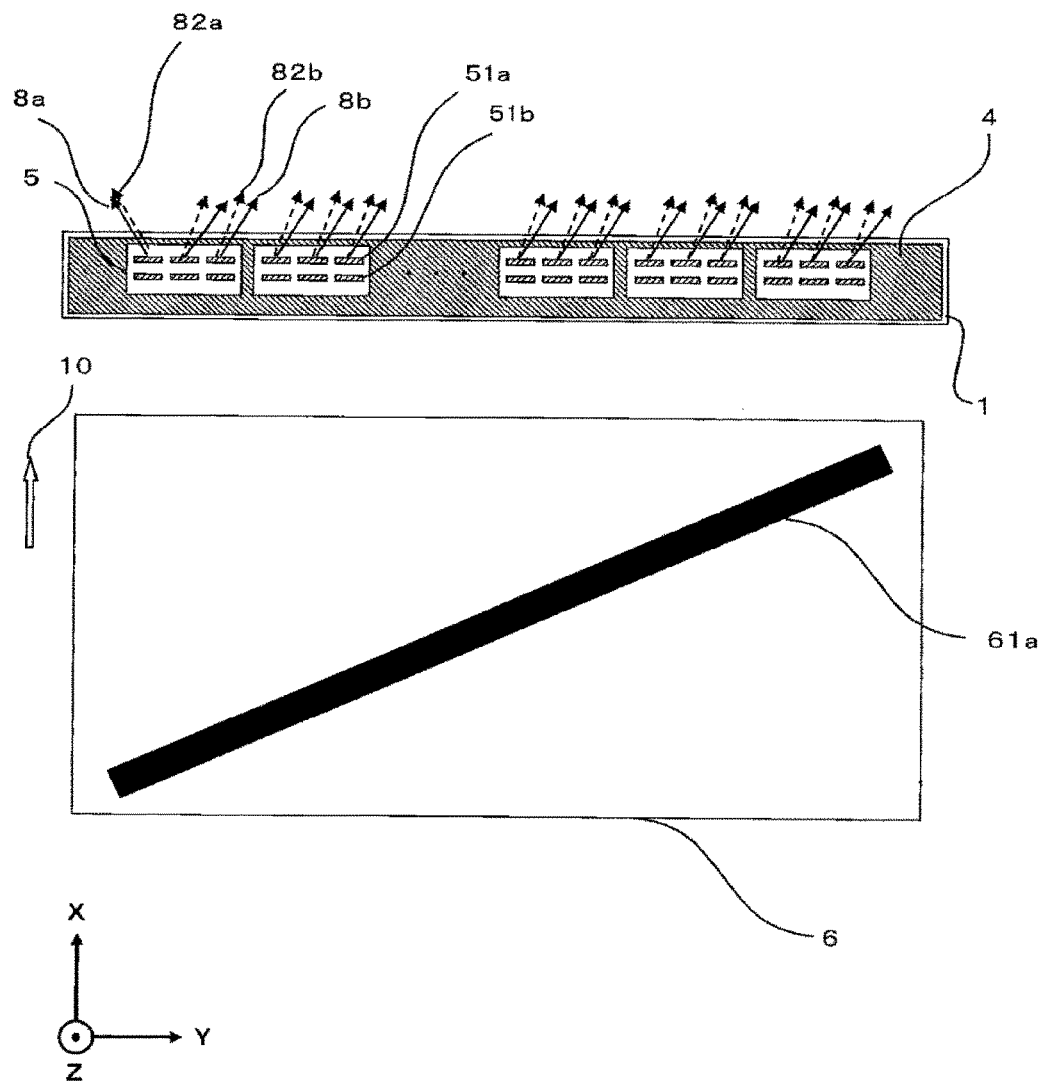
FIG. 14 is a diagram illustrating the detection magnetic flux vectors, for the Embodiment 1 of this disclosure, in the case in which the magnetic ink rotated counterclockwise in the X-Y plane is conveyed.

Operation and effect of the magnetic sensor device in Embodiment 1 of this disclosure illustrated in FIGS. 1 through 3 are described using FIGS. 12 through 15. FIG. 12 illustrates the By component (Y-direction component of the magnetic flux vector) applied to the anisotropic magnetoresistive (AMR) elements 51 (51a, 51b) in Embodiment 1 of this disclosure. FIG. 13 illustrates bias magnetic flux vectors 8 (8a, 8b) and the detection magnetic flux vectors 81 (81a, 81b), for Embodiment 1 of this disclosure, in the case in which magnetic ink 61a perpendicular to the Y direction is conveyed. FIG. 14 illustrates the detection magnetic flux vectors 82 (82a, 82b), for Embodiment 1 of this disclosure, in the case in which magnetic ink 61a is conveyed that is rotated counterclockwise in the X-Y plane. The By component applied to the anisotropic magnetoresistive (AMR) elements 51 (51a, 51b) is understood to be directed in a fixed direction by the second magnet for the major portion of the area. Due to this effect, with the exception of the end portion, stable readout of output of each of the anisotropic magnetoresistive (AMR) elements 51 (51a, 51b) becomes possible even when the magnetic ink is rotated in the X-Y plane.

Moreover, the present configuration enables the application of at least a fixed bias magnetic flux of a fixed direction in the Y direction. For example, in the case of detection of a ferromagnetic material, the magnetization vector directed to the non-magnetosensitive direction of the anisotropic magnetoresistive (AMR) effect element (longitudinal direction, or Y direction in this case) reverses, does not return, and thus a problem arises in that the resistance value of the anisotropic magnetoresistive (AMR) element changes from the initial value, application of the bias magnetic flux of at least a fixed value and at a fixed direction in the Y direction by the present configuration enables the suppression of reversal of the magnetization vector.

Figure 15:
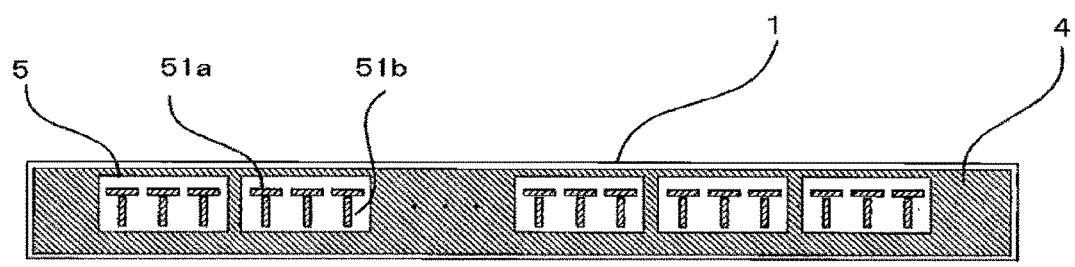
FIG. 15 is a top view, as viewed from above, of the magnetic sensor device of FIG. 2, using T-shaped bridges in bridge method type anisotropic magnetoresistive elements.

Moreover, although the anisotropic magnetoresistive (AMR) elements 51 (51a, 51b) are arrayed in parallel in the present configuration, second detection elements 51b of the anisotropic magnetoresistive (AMR) elements 51 are not necessary arrayed in parallel with first detection elements 51a, and a similar effect may also be obtained by adopting T-type bridges for the first detection elements 51a and second detection elements 51b, in which the longitudinal direction is taken to be the X direction, as illustrated in FIG. 15.

Further, in Embodiment 1 of this disclosure, a configuration is adopted in which the first magnetic material yoke 4 is arranged with the object of imparting a uniform bias magnetic flux to the anisotropic magnetoresistive (AMR) elements 51. However, in cases in which a sufficiently uniform bias magnetic flux can be applied to the anisotropic magnetoresistive (AMR) elements 51 even without the first magnetic material yoke, the position of the first magnetic yoke 4 and the position of a non-magnetic metal or substrate capable of carrying the anisotropic magnetoresistive (AMR) elements 51 can be swapped.

Embodiment 2

Figure 16:
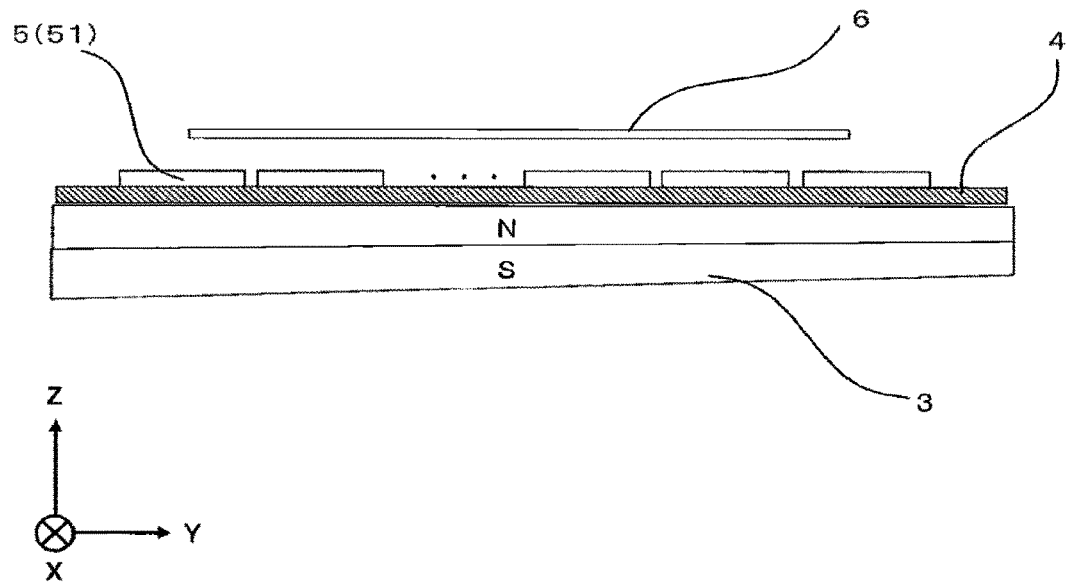
FIG. 16 is a side view of a longitudinal-direction of the magnetic sensor device of Embodiment 2 of this disclosure.

Figures are used for description of Embodiment 2 of this description. FIG. 16 is a side view of the longitudinal direction of the magnetic sensor device of Embodiment 2 of this description. In FIG. 16, a sloped magnet 3 is configured such that thickness of the magnetic pole direction (Z direction) decreases in the linear direction (Y direction). In FIG. 16, thickness decreases with a linear slope. Constituent elements in FIG. 16 that are the same or equivalent to those in FIG. 1 are assigned the same reference signs, and description of such elements is omitted.

The following components are provided in FIG. 16: the magnetic ink 61a arranged upon the detected object 6, the sloped magnet 3 for applying the bias magnetic flux to the anisotropic magnetoresistive (AMR) elements 51 (51a, 51b) arranged upon the anisotropic magnetoresistive (AMR) element chip 5, and the first magnetic material yoke 4 provided with the object of absorbing variability of the first magnet 1 and imparting a uniform magnetic bias flux to the anisotropic magnetoresistive (AMR) elements 51 (51a, 51b). The detected object 6 is conveyed in the X direction of the figure, and the magnetic ink 61a is detected upon passage above the anisotropic magnetoresistive (AMR) elements 51 (51a, 51b).

Also in the case of the configuration illustrated in FIG. 16, in the same manner as in Embodiment 1 of this disclosure, application is possible by the magnet 3 of a bias magnetic flux in a fixed direction relative to the Y direction, and the obtained effects are the same as those of Embodiment 1 of this disclosure. Further, although a linearly-sloping shape is used for the sloped magnet 3 of FIG. 16, the shape is not necessarily linearly-sloping, and a stepped shape may be used.

Embodiment 3

Figure 17:
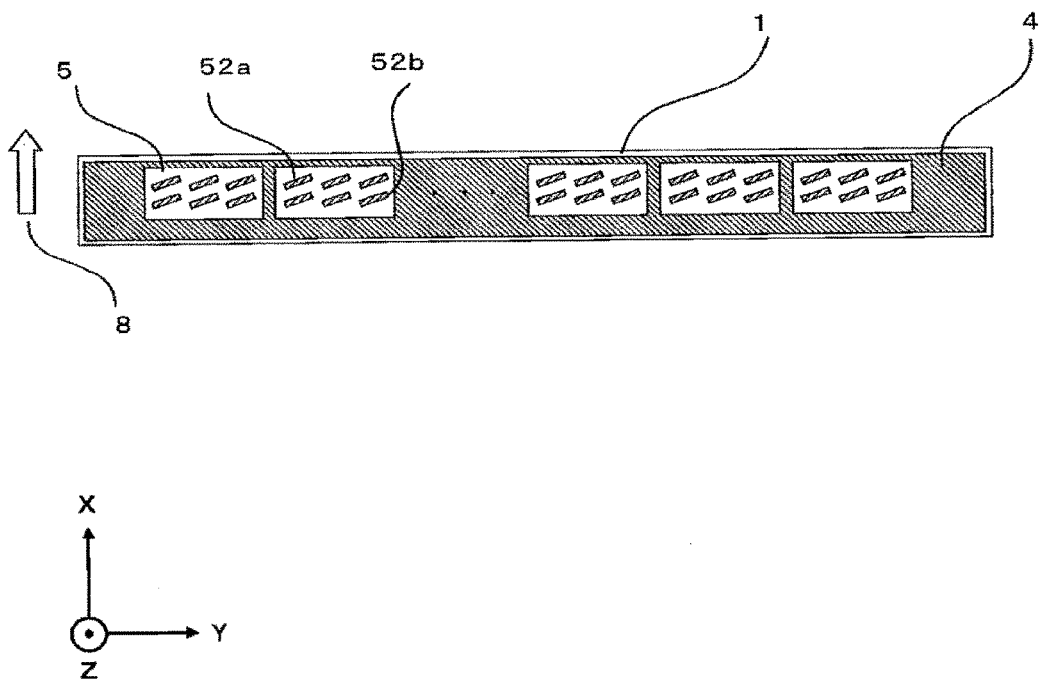
FIG. 17 is a top view of the magnetic sensor device in Embodiment 3 of this disclosure, as viewed from above.

FIG. 17 is a top view, as seen from above, of the magnetic sensor device of Embodiment 3 of this description. In FIG. 17, the side view, as viewed in the conveyance direction, has the same configuration as that of FIG. 6. Constituent elements in FIG. 17 that are the same or equivalent to those in FIG. 1 are assigned the same reference signs, and description of such elements is omitted. In this case, the X-direction components of the bias magnetic flux vectors 8 are taken to be applied in the +X direction to first detection elements 52a and second detection elements 52b. In the present configuration, anisotropic magnetoresistive (AMR) elements 52 (52a, 52b) are mounted in two rows in the X-Y plane and have the same tilt from the longitudinal direction (Y direction) toward the conveyance direction (X direction). In this configuration, for either the first detection elements 52a or the second detection elements 52b, application becomes possible of a magnetic flux in a fixed direction in the anisotropic magnetoresistive (AMR) element longitudinal +Y direction (non-magnetosensitive direction), the Y-direction magnetic flux density generated by the first magnet 1 and the like can be canceled out, and application of By in the same direction become possible. This thus enables the obtaining of the same effects as those of the Embodiment 1.

The effect of combination of the Embodiment 1 or 2 of this disclosure with the Embodiment 3 of this disclosure is synergistic, and application to the anisotropic magnetoresistive (AMR) elements 52 of the uniform positive Y-direction By along the entire longitudinal direction of the first magnet 1 has the effect of obtaining stable output from the magnetic sensor device due to the directions of the bias magnetic flux vectors being the same for all of the linearly disposed anisotropic magnetoresistive (AMR) elements 5 (52).

Embodiment 4

FIG. 18 is a top view of the magnetic sensor device of Embodiment 4 of this description, as viewed from above. In FIG. 18, the side view as seen from the conveyance direction has the same configuration as that of FIG. 6. Constituent elements in FIG. 18 that are the same or equivalent to those in FIG. 17 are assigned the same reference signs, and description of such elements is omitted. Here, the X-direction components of the bias magnetic flux vectors 8 are applied in the +X direction to the first detection elements 52a, and are applied in the −X direction to the second detection elements 52b. In the present configuration, the anisotropic magnetoresistive (AMR) elements 52 are mounted in two rows in the X-Y plane, tilted toward the conveyance direction (X direction) from the longitudinal direction (Y direction), resulting in a configuration in which the first detection elements 52a and second detection elements 52b are linearly symmetric relative to the Y axis. Moreover, the Y axis, which is the axis of linear symmetry of the first detection elements 52a and second detection elements 52b, extends through the conveyance-direction (X-direction) central portion of the first magnet 1. In this configuration, due to the +X-direction bias magnetic flux relative to the first detection elements 52a and the −X-direction bias magnetic flux relative to the second detection elements 52b, application becomes possible of a magnetic flux in a fixed direction in the anisotropic magnetoresistive (AMR) element longitudinal +Y direction (non-magneto-sensitive direction) to both the first detection elements 52a and the second detection elements 52b, the Y-direction magnetic flux density produced by the first magnet 1 and the like can be canceled out, and application of By in the same direction becomes possible. Thus the same effects are obtained as those of Embodiment 1 of this disclosure.

The effect of combination of the Embodiment 1 or 2 of this disclosure with the Embodiment 4 of this disclosure is synergistic, and application to the anisotropic magnetoresistive (AMR) elements 52 of the uniform positive Y-direction By along the entire longitudinal direction of the first magnet 1 has the effect of obtaining stable output from the magnetic sensor device due to the directions of the bias magnetic flux vectors being the same over all of the linearly disposed anisotropic magnetoresistive (AMR) elements 5 (52).

Embodiment 5

FIG. 19 is a side view of the longitudinal direction of the magnetic sensor device of Embodiment 5 of this description. Constituent elements in FIG. 19 that are the same or equivalent to those in FIG. 1 are assigned the same reference signs, and description of such elements is omitted. In the present configuration, with the object of allowing non-contacting conveyance of the detected object 6, the first magnet 1 and second magnet 2 are arranged above the detected object 6, and the anisotropic magnetoresistive (AMR) element chip 5 and a magnetic material carrier 9, with the object of imparting a uniform bias magnetic flux, are arranged below the detected object 6. Also in the case of this configuration, effects are obtained that are similar to the effects obtained by arrangement of magnets, or by mounting the anisotropic magnetoresistive (AMR) elements at a tilt, similarly to the configurations of Embodiments 1 through 4 of this disclosure.

Embodiment 6

Figure 21:
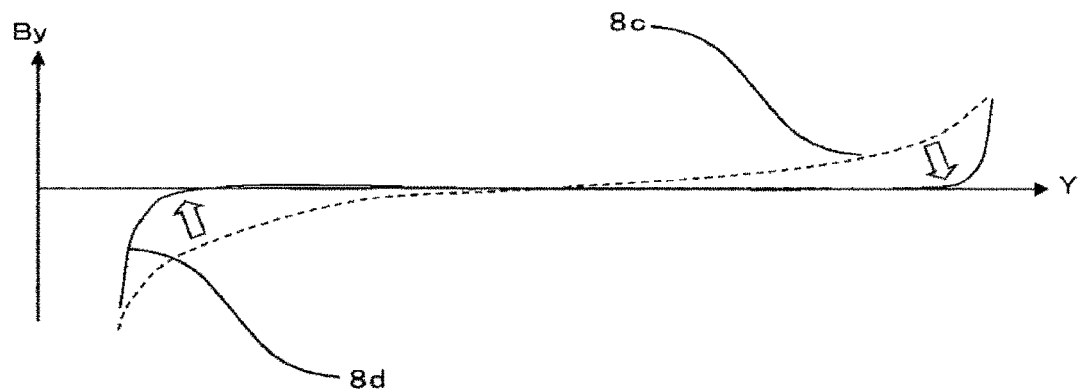
FIG. 21 is a graph illustrating the By component applied to the anisotropic magnetoresistive elements in Embodiment 6 of this disclosure.
Figure 22:
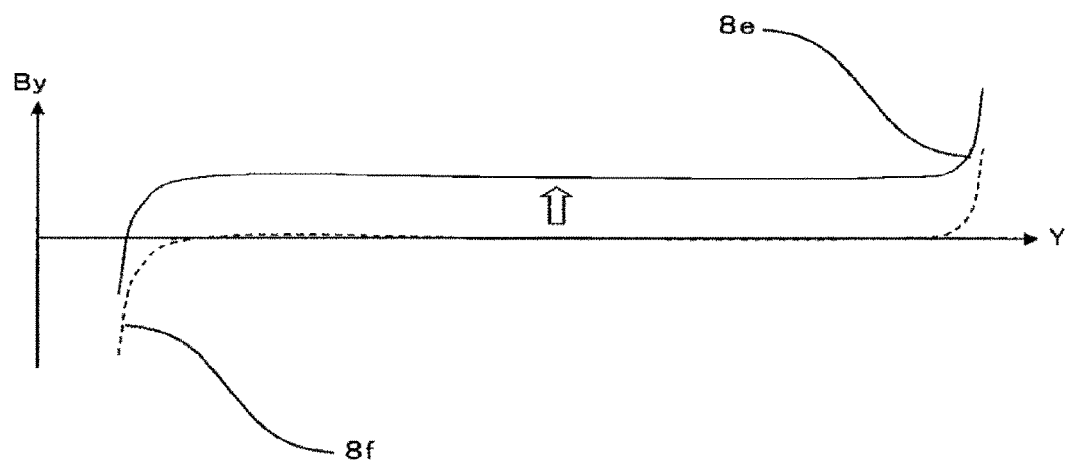
FIG. 22 is a graph illustrating the By component applied to the anisotropic magnetoresistive elements in Embodiment 6 of this disclosure.

FIG. 20 is a side view of the longitudinal-direction of the of the magnetic sensor device of Embodiment 6 of this description. FIG. 21 is a graph of the By component applied to the anisotropic magnetoresistive (AMR) elements in Embodiment 6 of this description. FIG. 22 is a graph of the By component applied to the anisotropic magnetoresistive (AMR) elements in Embodiment 6 of this description. Constituent elements in FIG. 20 that are the same or equivalent to those in FIG. 1 are assigned the same reference signs, and description of such elements is omitted.

In Embodiment 1 of this disclosure, the second magnet 2 is arranged at one end portion of the first magnet 1. However, in Embodiment 6 of this description, each of small magnets 2a and 2b is arranged at a respective end portion of the first magnet 1. In FIG. 20, each of the N poles of the second magnets 2a and 2b faces the S pole of the first magnet 1. Due to use of this configuration, as illustrated in FIG. 21, the Y-direction component By of the magnetic flux vectors of both end portions of the first magnet 1 approaches zero. In FIG. 21, the dashed line 8c is the Y-direction component By of the magnetic flux vectors in the case in which the small second magnets 2a and 2b are not provided; and the solid line 8d is the Y-direction component By of the magnetic flux vectors in the case in which the small second magnets 2a and 2b are provided. Thus the bias magnetic flux vectors applied to the anisotropic magnetoresistive (AMR) element 51 in Embodiment 6 of this description cause the Y-direction component By of the magnetic flux vectors to become uniformly near-zero along the entire longitudinal direction of the first magnet 1.

Furthermore, in FIG. 20, the configuration of the anisotropic magnetoresistive (AMR) elements 5 (52) is the configuration in which the anisotropic magnetoresistive (AMR) elements 52 (52a, 52b) are tilted in the same direction in the X-Y plane as illustrated in FIG. 17, or is the configuration in which the first detection elements 52a and the second detection elements 52b are tilted in the X-Y plane with linear symmetry relative to the Y axis as illustrated in FIG. 18.

Due to arrangement of the anisotropic magnetoresistive (AMR) elements 5 (52) in this manner, as illustrated in FIG. 22, a uniform Y-direction component By of the magnetic flux vector is applied over the entire longitudinal direction of the first magnet 1 at the plus side in the Y direction of the anisotropic magnetoresistive (AMR) elements 52. Thus stable output is obtained from the magnetic sensor device due to matching of the bias magnetic flux vector directions over the entire linearly-arranged anisotropic magnetoresistive (AMR) elements 5 (52). In FIG. 22, the dashed line 8e is the Y-direction component By of the magnetic flux vectors in the case in which the anisotropic magnetoresistive (AMR) elements 52 (52a, 52b) are not tilted; and the solid line 8f is the Y-direction component By of the magnetic flux vectors in the case in which the anisotropic magnetoresistive (AMR) elements 52 (52a, 52b) are tilted in the X-Y plane.

In Embodiment 6 of this description, a configuration is used in which each of the second magnets 2a and 2b is arranged at a respective end portion of the first magnet 1. However, a configuration may be used, as in Embodiment 2 (FIG. 16) of this description, in which the sloped magnet 3 is used, and thickness decreases in the polar direction (Z direction) from both end portions toward the center portion in the linear direction (Y direction).

Embodiment 7

Figure 23:
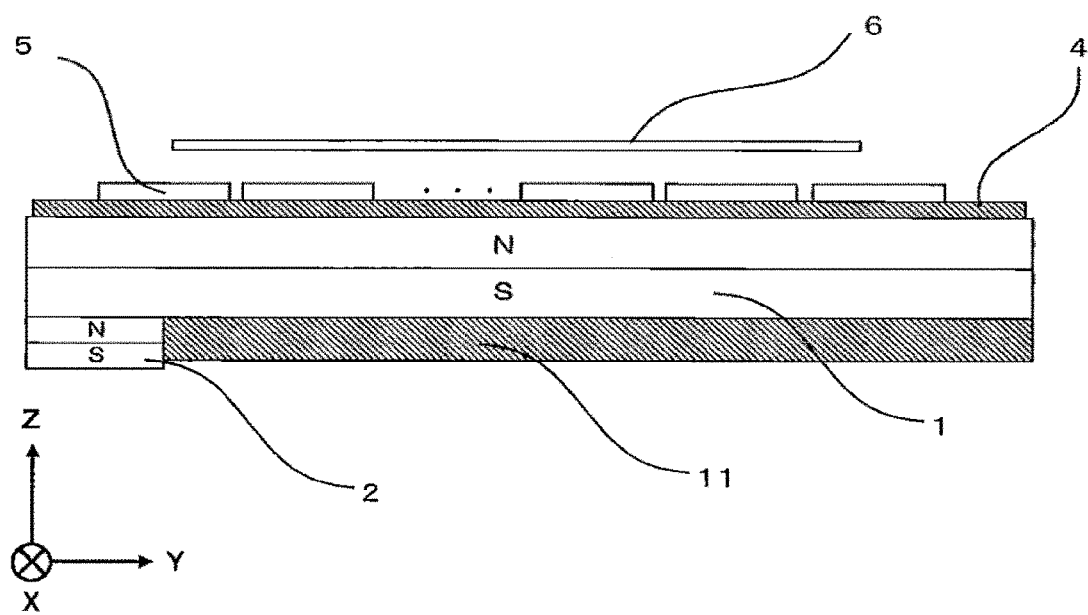
FIG. 23 is a side view of a longitudinal-direction of a magnetic sensor device in Embodiment 7 of this disclosure.

FIG. 23 is a side view of the longitudinal-direction of the magnetic sensor device of Embodiment 7 of this description. The magnetic sensor device in Embodiment 7 of this description has a second magnetic material yoke 11 arranged on the surface where the second magnet 2 is not arranged at the S pole of the first magnet 1 of the magnetic sensor device of Embodiment 1 of this disclosure illustrated in FIG. 1. Constituent elements in FIG. 23 that are the same or equivalent to those in FIG. 1 are assigned the same reference signs, and description of such elements is omitted.

Figure 24:
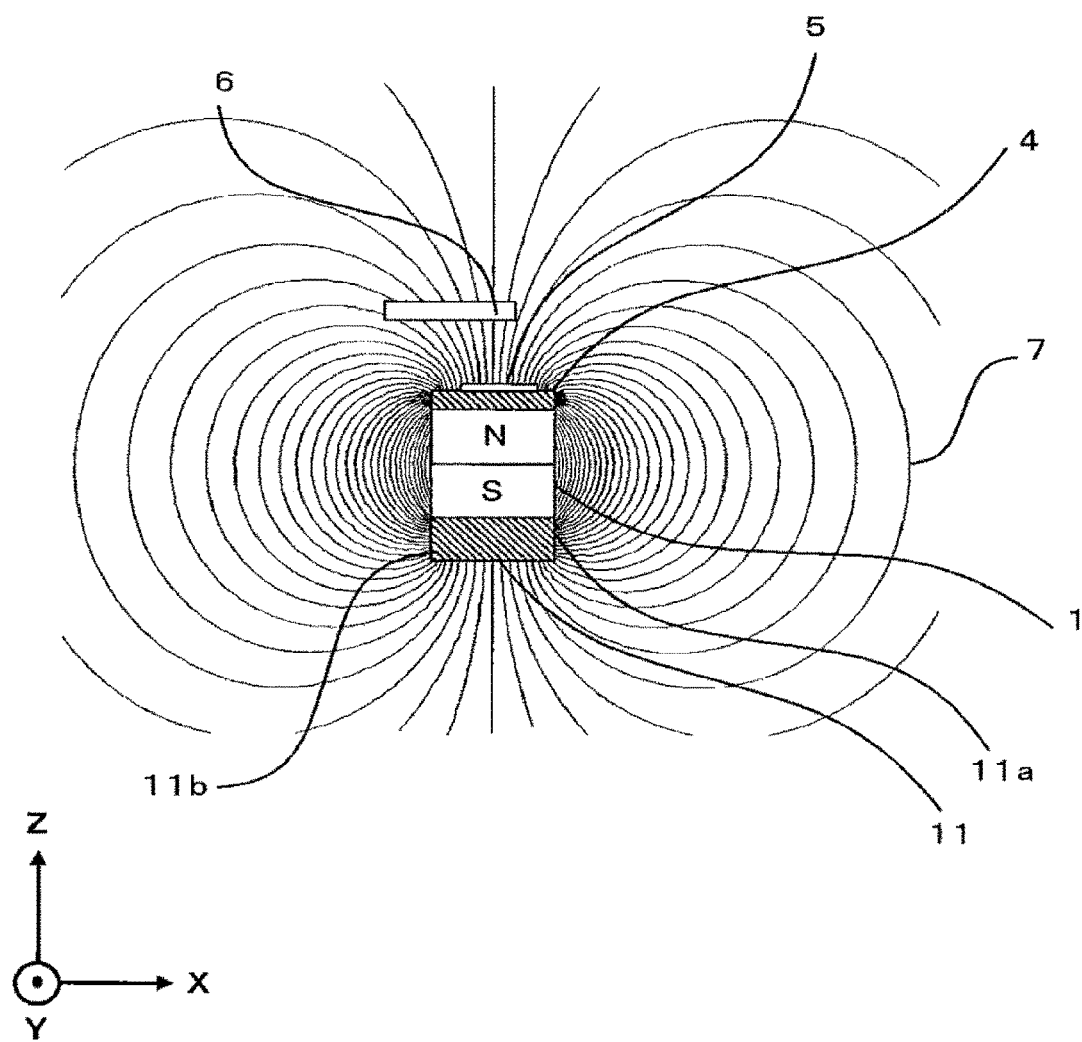
FIG. 24 is a diagram of distribution of magnetic field lines, as seen in the X-Z plane, of the magnetic sensor device in Embodiment 7 of this disclosure.

FIG. 24 is a diagram of the distribution of magnetic field lines when the magnetic sensor device of Embodiment 7 of this description is viewed in the X-Z plane. Constituent elements in FIG. 24 that are the same or equivalent to those in FIG. 3 are assigned the same reference signs, and description of such elements is omitted. At a face, of the direction perpendicular and orthogonal to the conveyance direction 10, of the S pole of the first magnet 1 of the magnetic sensor device in FIG. 24, the second magnetic yoke 11 is arranged on the surface except for the surface where the second magnet 2 is arranged. The magnetic flux (magnetic field lines 7) from the S pole of the first magnet 1 concentrates in the second magnetic yoke 11, and the magnetic flux (magnetic field lines 7) from the first magnetic yoke 4 concentrate in and penetrate the longitudinal-direction side faces 11a and 11b of the second magnetic yoke 11, forming a magnetic circuit.

That is to say, the magnetic pathway between the first magnetic yoke 4 disposed at the N pole of the first magnet 1 and the S pole of the first magnet 1 becomes shorter in comparison to the configuration of FIG. 1 of the magnetic sensor device in Embodiment 1 of this disclosure, and thus unnecessary leakage of magnetic flux (magnetic field lines 7) decreases, and as a result, magnetic flux density (density of the magnetic field line 7) from the first magnetic yoke 4 arranged at the N pole of the first magnet 1 becomes large, and the Z component of the magnetic flux vectors 8 becomes large. Thus such configuration has the effect of improving sensitivity of detection of the detected object 6 in comparison to the magnetic sensor device of Embodiment 1 of this disclosure.

Figure 25:
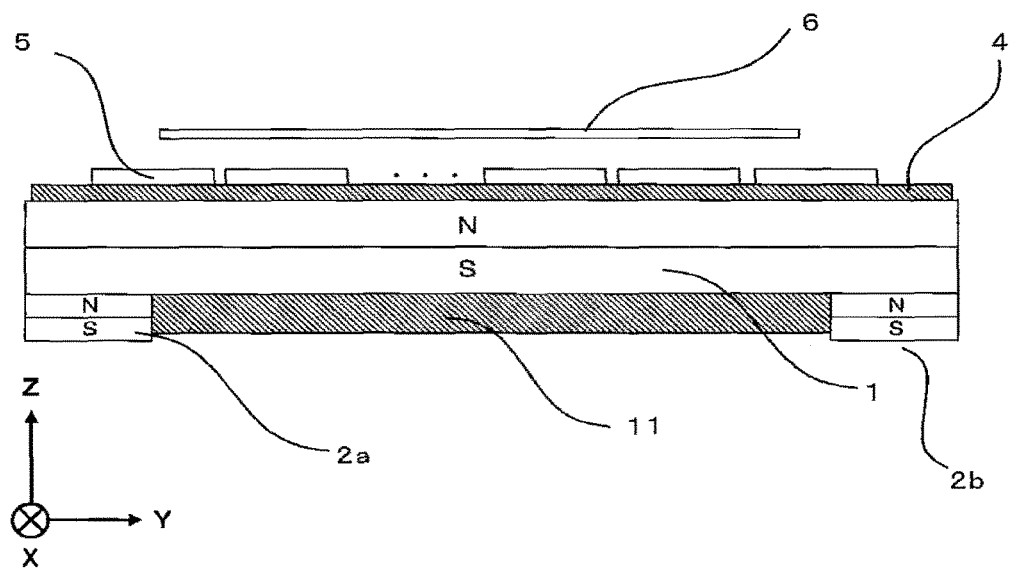
FIG. 25 is a side view of a longitudinal-direction of another magnetic sensor device in Embodiment 7 of this disclosure.

In the same manner, the magnetic sensor of Embodiment 6 of this disclosure illustrated in FIG. 20 also has the same operational effect, by arrangement of the second magnetic material yoke 11 at the direction orthogonal to the conveyance direction face of the S pole of the first magnet 1 between the second magnet 2a and the second magnet 2b. FIG. 25 is a side view of longitudinal direction of another magnetic sensor device in Embodiment 7 of this description, in which the second magnetic material yoke 11 is disposed at the direction orthogonal to the conveyance direction face of the S pole of the first magnet 1 between the second magnet 2a and the second magnet 2b, for the magnetic sensor of Embodiment 6 of this disclosure. Constituent elements in FIG. 25 that are the same or equivalent to those in FIG. 20 are assigned the same reference signs, and description of such elements is omitted.

In Embodiments 1 through 7 of this description, for the magnetic poles of the first magnet 1 and second magnet 2, cases are described in which the anisotropic magnetoresistive element chip 5 (anisotropic magnetoresistive (AMR) element 51, 52) side is taken to be the N pole, and the side opposite to the anisotropic magnetoresistive element chip 5 (anisotropic magnetoresistive (AMR) element 51, 52) side is taken to be the S pole. However, the same effect would be obtained by reversing the N-S pole orientations of the magnets (first magnet 1 and second magnet 2), that is to say, by taking the anisotropic magnetoresistive element chip 5 (anisotropic magnetoresistive (AMR) element 51, 52) side to be the S pole, and by taking the side opposite to the anisotropic magnetoresistive element chip 5 (anisotropic magnetoresistive (AMR) element 51, 52) side to be the N pole.

This application claims the benefit of Japanese Patent Application No. 2014-99724, filed on May 13, 2014. The entire specification, claims, and drawings of Japanese Patent Application No. 2014-99724 are incorporated by reference herein.

REFERENCE SIGNS LIST

1 First magnet
2 Second magnet
2a Second magnet
2b Second magnet
3 Sloped magnet
4 First magnetic material yoke
5 Anisotropic magnetoresistive element chip
51 Anisotropic magnetoresistive element
51a Anisotropic magnetoresistive element (first detection element)
51b Anisotropic magnetoresistive element (second detection element)
52 Anisotropic magnetoresistive element
52a Anisotropic magnetoresistive element (first detection element)
52b Anisotropic magnetoresistive element (second detection element)
6 Detected object
61a Magnetic ink
61b Magnetic ink
611a Magnetic flux change
611b Magnetic flux change
7 Magnetic field line
8 Bias magnetic flux vector
8a Bias magnetic flux vector
8b Bias magnetic flux vector
8c Dashed line
8d Solid line
8e Dashed line
8f Solid line
81 Detection magnetic flux vector
81a Detection magnetic flux vector
81b Detection magnetic flux vector
82 Detection magnetic flux vector
82a Detection magnetic flux vector
82b Detection magnetic flux vector
9 Magnetic material carrier
10 Conveyance direction
11 Second magnetic material yoke
11a Side face
11b Side face

The invention claimed is:

1. A magnetic sensor device comprising:
    a magnet extending in a longitudinal direction orthogonal to a conveyance direction of a detected object having a magnetic material, the magnet having magnetic poles that are different in a direction perpendicular to the conveyance direction; and
    anisotropic magnetoresistive elements arranged linearly in the longitude direction on a detected object-side magnetic pole of the magnet, wherein
    a length of the magnet in the direction perpendicular to the conveyance direction is longer for an end portion in the longitudinal direction than for a central portion in the longitudinal direction.

2. The magnetic sensor device according to claim 1, further comprising a magnetic material yoke arranged between the anisotropic magnetoresistive elements and the magnet.

3. The magnetic sensor device according to claim 1, wherein the magnet comprises:
    a first magnet for which length in the direction perpendicular to the conveyance direction is the same along the longitudinal direction; and
    a second magnet having mutually different magnetic poles in the direction perpendicular to the conveyance direction, the second magnet being disposed at an end of portion in the longitudinal direction of the first magnet, and a magnetic pole of a surface of the second magnet contacting the first magnet being opposite in polarity to a magnetic pole of the first magnet opposite to the detected object.

4. The magnetic sensor device according to claim 3, further comprising a second magnetic material yoke arranged on a surface, that is the magnetic pole of the first magnet opposite to the detected object side, except where the second magnet is arranged.

5. The magnetic sensor device according to claim 1, wherein the length of the magnet in the direction perpendicular to the conveyance direction becomes shorter from the end portion toward the center portion in the longitudinal direction.

6. The magnetic sensor device according to claim 1, wherein the anisotropic magnetoresistive elements are tilted at determined angles from the longitudinal direction toward the conveyance direction side.

7. A magnetic sensor device comprising:
    a magnet extending in a longitudinal direction orthogonal to a conveyance direction of a detected object having a magnetic material, the magnet having magnetic poles that are different in a direction perpendicular to the conveyance direction; and
    a plurality of anisotropic magnetoresistive elements arranged linearly in the longitude direction on a detected object-side magnetic pole of the magnet, wherein
    the anisotropic magnetoresistive elements are tilted at determined angles from the longitudinal direction toward the conveyance direction side, and
    direction of a component in the longitudinal direction of a magnetic field generated by the magnet and applied to each of the anisotropic magnetoresistive elements is in the same direction except for the anisotropic magnetoresistive elements disposed at an end portion of the plurality of the anisotropic magnetoresistive elements in the longitudinal direction.

8. The magnetic sensor device according to claim 1, wherein the anisotropic magnetoresistive elements are arranged in two rows along the longitudinal direction.

9. The magnetic sensor device according to claim 8, wherein
    a center in the conveyance direction of the two rows of the anisotropic magnetoresistive elements is shifted to a determined position in the conveyance direction from a center position of the magnet in the conveyance direction.

10. The magnetic sensor device according to claim 8, wherein
    one row of the anisotropic magnetoresistive elements is shifted from a center position of the magnet in the conveyance direction toward one end side of the magnet in the conveyance direction; and
    the other row of the anisotropic magnetoresistive elements is shifted from the center position of the magnet in the conveyance direction toward the other end side of the magnet in the conveyance direction.

11. The magnetic sensor device according to claim 6, wherein
    the anisotropic magnetoresistive elements are arranged as two rows along the longitudinal direction;
    one row of the anisotropic magnetoresistive elements is shifted from a center position of the magnet in the conveyance direction toward one end side of the magnet in the conveyance direction;
    the other row of the anisotropic magnetoresistive elements is shifted from the center position of the magnet in the conveyance direction toward the other end side of the magnet in the conveyance direction; and
    the direction of tilt of the row is different from the direction of tilt of the other row.

12. The magnetic sensor device according to claim 11, wherein the anisotropic magnetoresistive elements are arranged with linear symmetry based on the longitudinal direction passing through the center position in the conveyance direction.

13. The magnetic sensor device according to claim 7, wherein the anisotropic magnetoresistive elements are arranged in two rows along the longitudinal direction.

14. The magnetic sensor device according to claim 13, wherein
    a center in the conveyance direction of the two rows of the anisotropic magnetoresistive elements is shifted to a determined position in the conveyance direction from a center position of the magnet in the conveyance direction.

15. The magnetic sensor device according to claim 13, wherein
    one row of the anisotropic magnetoresistive elements is shifted from a center position of the magnet in the conveyance direction toward one end side of the magnet in the conveyance direction; and
    the other row of the anisotropic magnetoresistive elements is shifted from the center position of the magnet in the conveyance direction toward the other end side of the magnet in the conveyance direction.

16. The magnetic sensor device according to claim 7, wherein
    the anisotropic magnetoresistive elements are arranged as two rows along the longitudinal direction;
    one row of the anisotropic magnetoresistive elements is shifted from a center position of the magnet in the conveyance direction toward one end side of the magnet in the conveyance direction;

the other row of the anisotropic magnetoresistive elements is shifted from the center position of the magnet in the conveyance direction toward the other end side of the magnet in the conveyance direction; and the direction of tilt of the row is different from the direction of tilt of the other row.

17. The magnetic sensor device according to claim 16, wherein the anisotropic magnetoresistive elements are arranged with linear symmetry based on the longitudinal direction passing through the center position in the conveyance direction.

* * * * *